US012716916B2

(12) United States Patent
Yamawaki

(10) Patent No.: US 12,716,916 B2
(45) Date of Patent: Aug. 25, 2026

(54) MAGNETIC SENSOR DEVICE

(71) Applicant: TDK CORPORATION, Tokyo (JP)

(72) Inventor: Kazuma Yamawaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 183 days.

(21) Appl. No.: 18/582,196

(22) Filed: Feb. 20, 2024

(65) Prior Publication Data

US 2024/0280611 A1 Aug. 22, 2024

(30) Foreign Application Priority Data

Feb. 17, 2023 (JP) ................................ 2023-023483

(51) Int. Cl.

*G01R 15/20* (2006.01)
*G01B 7/30* (2006.01)
*G01R 19/00* (2006.01)
*G03B 13/36* (2021.01)
*H04N 23/68* (2023.01)

(52) U.S. Cl.

CPC ............ *G01R 15/207* (2013.01); *G01B 7/30* (2013.01); *G01R 19/0092* (2013.01); *G03B 13/36* (2013.01); *H04N 23/6812* (2023.01); *H04N 23/687* (2023.01)

(58) Field of Classification Search

CPC .. G01R 15/207; G01R 19/0092; G01R 33/06; G03B 13/36

See application file for complete search history.

(56) References Cited

U.S. PATENT DOCUMENTS

2005/0249984 A1* 11/2005 Ohmori ................ G11B 5/7379 427/523
2006/0221498 A1* 10/2006 Bonhote .............. G11B 5/3136
2008/0061775 A1* 3/2008 Kikuiri .................. B82Y 25/00 324/244
2009/0045810 A1* 2/2009 Sugihara ................ H10B 61/00 324/252
2015/0128431 A1* 5/2015 Kuo ....................... G01R 33/09 324/252
2018/0033955 A1* 2/2018 Wong ..................... H10N 50/85
2018/0216963 A1* 8/2018 Uberti .................... G01D 5/145

(Continued)

FOREIGN PATENT DOCUMENTS

JP 2008-066324 A 3/2008
JP 2015-007551 A 1/2015

(Continued)

OTHER PUBLICATIONS

Translation of Jan. 28, 2026 Office Action issued in Japanese Application No. 2023-023483.

*Primary Examiner* — Dominic E Hawkins
(74) *Attorney, Agent, or Firm* — Oliff PLC

(57) ABSTRACT

A magnetic sensor device with stable output characteristics is provided, which includes: a supporting substrate that has a first face; a magnetic detection element; a protective film, which is a layered film that is disposed on the first face side and that has a first layer of which a primary component is alumina and a second layer of which a primary component is silica; and a wiring layer that is disposed on the first face side and is situated at a position farther from the supporting substrate than the layered film, and moreover extends along the first face. The magnetic detection element is disposed inside the layered film.

17 Claims, 15 Drawing Sheets

(56) References Cited

U.S. PATENT DOCUMENTS

| | | | | |
|---|---|---|---|---|
| 2019/0302198 | A1* | 10/2019 | Masuda | G01R 33/0011 |
| 2020/0064416 | A1* | 2/2020 | Fujiura | G01R 33/072 |
| 2021/0080807 | A1* | 3/2021 | Sharma | H04N 23/683 |
| 2021/0149000 | A1 | 5/2021 | Saito et al. | |

FOREIGN PATENT DOCUMENTS

| | | | |
|---|---|---|---|
| JP | 2019-174438 | A | 10/2019 |
| JP | 2020-017692 | A | 1/2020 |
| JP | 2021-081293 | A | 5/2021 |
| WO | 2016-051726 | A | 4/2016 |

* cited by examiner 2A
3
2
51
40P
40
41
52
6P
53
6
42

FIG. 8A
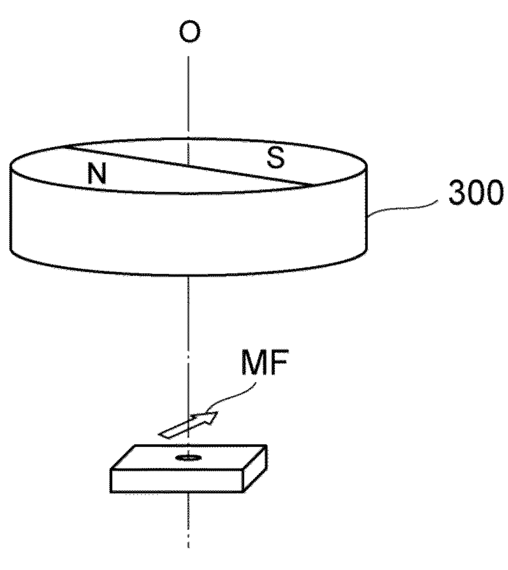
FIG. 8B
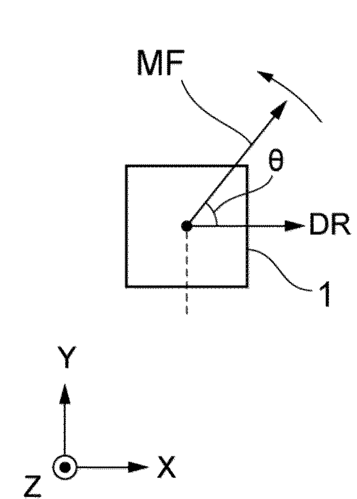
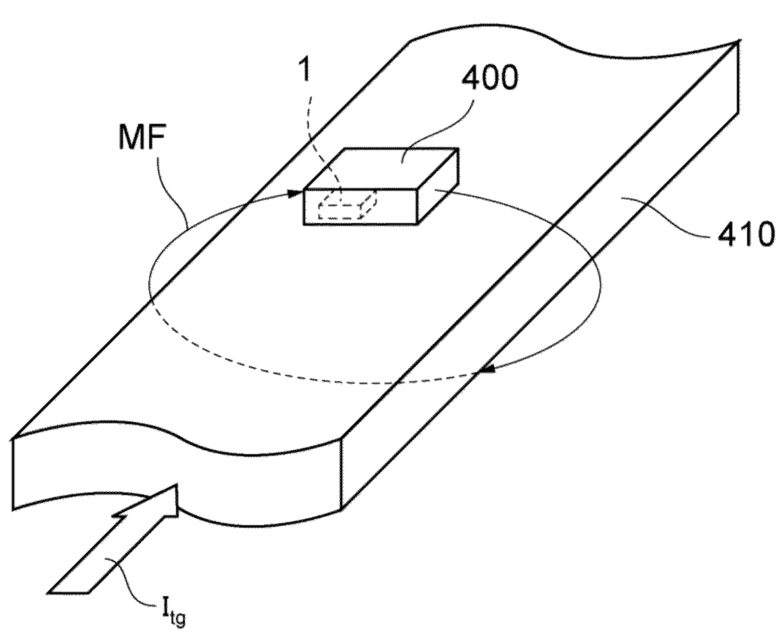
FIG. 9

MAGNETIC SENSOR DEVICE

CROSS-REFERENCES TO RELATED APPLICATIONS

This application claims the benefit of Japanese Priority Patent Application No. 2023-023483 filed on Feb. 17, 2023, the entire contents of which are incorporated herein by reference.

BACKGROUND

The present disclosure relates to a magnetic sensor device.

A magnetic sensor device includes a magnetic detection element made of a magnetic material (e.g., see Patent Publication JP-A-2021-081293). Applying external force to the magnetic material causes fluctuation in response to a magnetic field, due to the inverse magnetostriction effect. In particular, tunnel magnetoresistance effect elements exhibit excellent output characteristics with a great magnetoresistance (MR) ratio, but also the output characteristics readily fluctuate under external force.

SUMMARY

The present disclosure has been made in light of the foregoing circumstances, and an object thereof is to provide a magnetic sensor device with stable output characteristics.

A magnetic sensor device according to an aspect of the present disclosure includes: a supporting substrate that has a first face; a magnetic detection element; a layered film that is disposed on the first face side and that has a first layer of which a primary component is alumina, and a second layer of which a primary component is silica; and a wiring layer that is disposed on the first face side and is situated at a position farther from the supporting substrate than the layered film, and moreover extends along the first face, wherein the magnetic detection element is disposed inside the layered film.

According to the present disclosure, a magnetic sensor device with stable output characteristics can be provided.

BRIEF DESCRIPTION OF DRAWINGS

The accompanying drawings are included to provide a further understanding of the disclosure and are incorporated in and constitute a part of this specification. The drawings illustrate example embodiments and, together with the specification, serve to explain the principles of the technology.

FIGS. 8A and 8B show diagrams illustrating an example of a magnetic sensor device that is configured as an angular sensor;

FIG. 9 shows a diagram illustrating an example of a magnetic sensor device that is configured as part of a current sensor;

DETAILED DESCRIPTION

A protective film surrounding the magnetic detection element is made of a material such as silica or the like. There are magnetic sensor devices in which the magnetic detection element is externally connected by a wiring layer without flexure, rather than bonding wires that have flexure, however, the coefficient of linear expansion is greatly different between metal making up this wiring layer, and the silica. Accordingly, thermal stress occurring between the wiring layer and the magnetic detection element surrounded by the silica due to change in temperature may cause the output characteristics of the magnetic detection element to fluctuate, thereby reducing measurement precision of the magnetic sensor device.

The present disclosure has been made in light of the foregoing circumstances, and an object thereof is to provide a magnetic sensor device with stable output characteristics.

Figure 1:
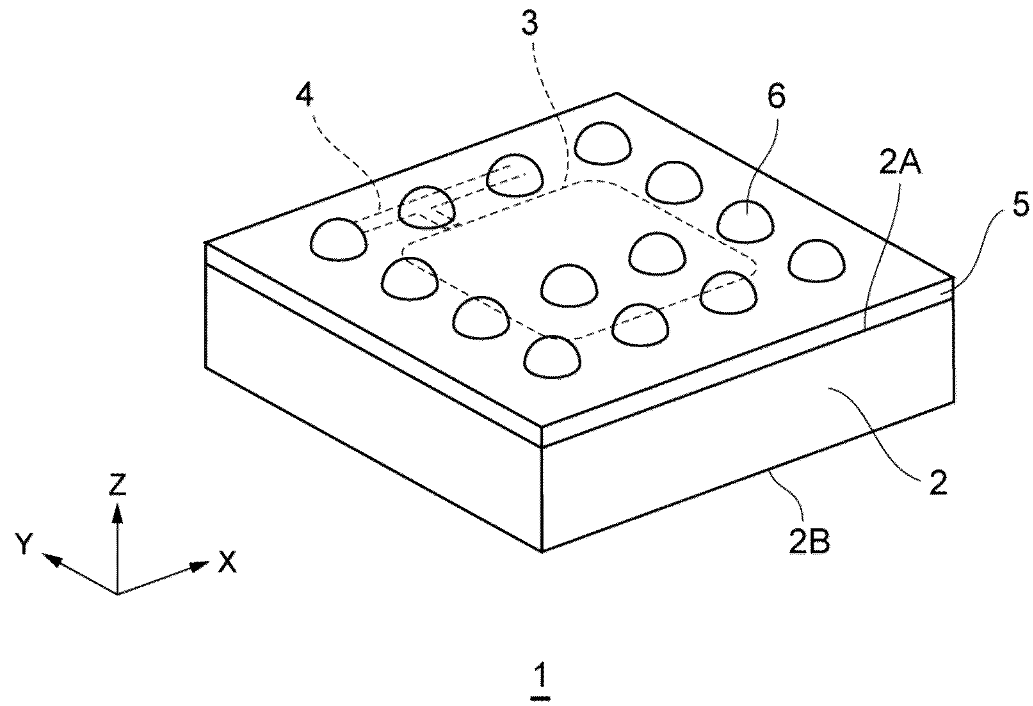
FIG. 1 shows a perspective view of a magnetic sensor device according to one example embodiment.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. FIG. 1 is a perspective view of a magnetic sensor device 1 according to one example embodiment. In the example that is illustrated, the magnetic sensor device 1 includes a supporting substrate 2, a sensor chip 3, a wiring layer 4, and so forth. The magnetic sensor device 1 may further includes a sealing resin 5, electrodes 6 and so forth.

As illustrated in FIG. 1, the supporting substrate 2 may be formed as a flat plate that has a first face 2A, and a second face 2B on the opposite side from the first face 2A. In the description below, a thickness direction of the supporting substrate 2 will be referred to as "perpendicular direction Z" or "up-down direction Z", with a direction from the second face 2B toward the first face 2A being referred to as "upward", and a direction from the first face 2A toward the second face 2B being referred to as "downward". The first face 2A extends parallel to an X-Y plane that is orthogonal to the perpendicular direction Z.

Figure 2:
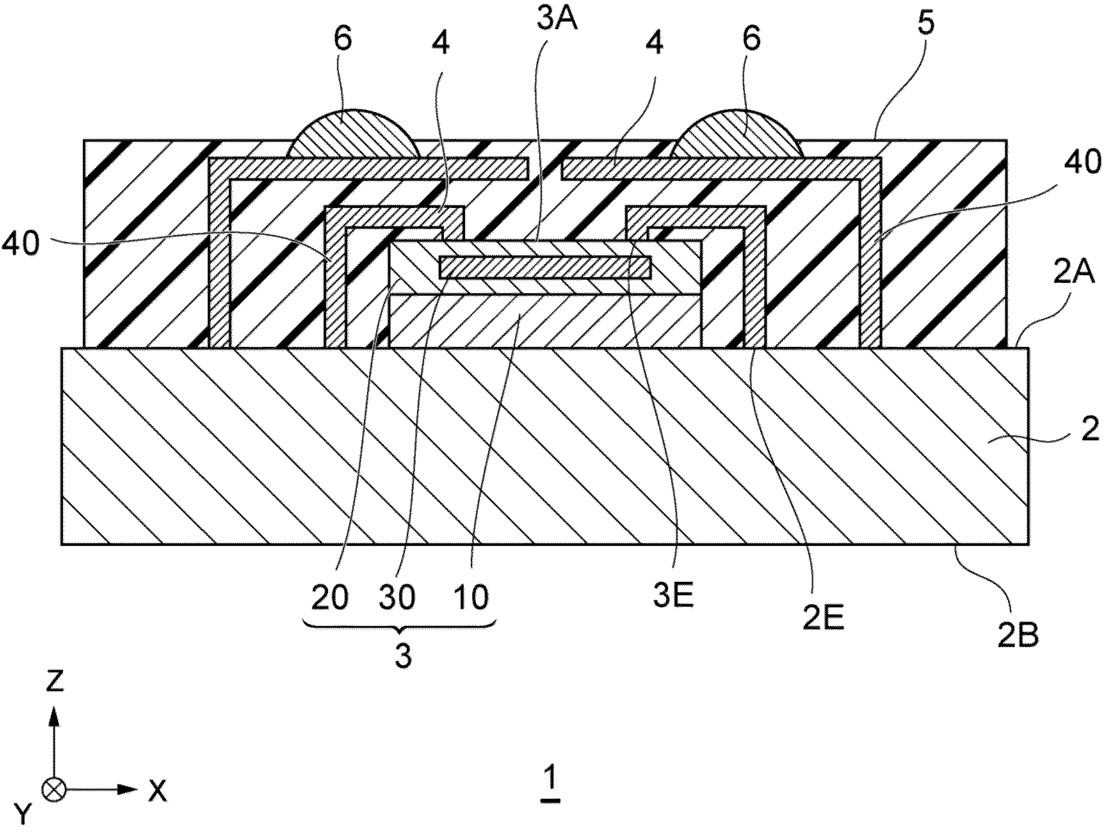
FIG. 2 shows a cross-sectional view schematically illustrating an example of an internal structure of the magnetic sensor device illustrated in FIG. 1.

FIG. 2 is a cross-sectional view schematically illustrating an example of an internal structure of the magnetic sensor device 1 illustrated in FIG. 1. In the example that is illustrated, the supporting substrate 2 is an application-specific integrated circuit (ASIC), with an electrode 2E that is electrically connected to the wiring layer 4 provided on the first face 2A. The supporting substrate 2 is not limited to being an ASIC, and may be a silicon substrate or a sapphire substrate, or may be a relay substrate (interposer) in which just wiring not containing an integrated circuit is formed on such substrates.

As illustrated in FIG. 2, the sensor chip 3 may be fixed to the first face 2A of the supporting substrate 2 by an adhesive agent.

The sensor chip 3 may include a sensor substrate 10, a magnetic detection element 30 provided on the sensor substrate 10, a protective film 20 surrounding the magnetic detection element 30, and so forth. The sensor substrate 10 is a silicon substrate for example, and may be disposed between the first face 2A of the supporting substrate 2 and the protective film 20. According to this disclosure, the first layer with the primary component of alumina that has excellent toughness is included, and accordingly cracks are not readily formed in the magnetic detection element even when shock is applied at the time of fixing the sensor substrate to the supporting substrate. The configuration of the magnetic sensor device 1 is not limited to the example that is illustrated, and may be a monolithic structure in which the sensor substrate 10 is omitted and the supporting substrate 2 and the magnetic detection element 30 are configured as an integral structure by photolithography.

The wiring layer 4 is disposed on the first face 2A side of the supporting substrate 2, and extends in parallel with the first face 2A of the supporting substrate 2. The wiring layer 4 is at a position farther from the supporting substrate 2 than the protective film 20, and may electrically connect the electrode 2E of the supporting substrate 2 and an electrode 3E provided on an upper face 3A of the sensor chip 3, via a plurality of vias 40 extending in the perpendicular direction Z.

The sealing resin 5 may be disposed on the first face 2A side of the supporting substrate 2, and may cover the sensor chip 3 and the wiring layer 4. The electrodes 6 are, for example, solder balls or copper pillars, and may be electrically connected to the wiring layer 4 and be exposed from the sealing resin 5.

Figure 3:
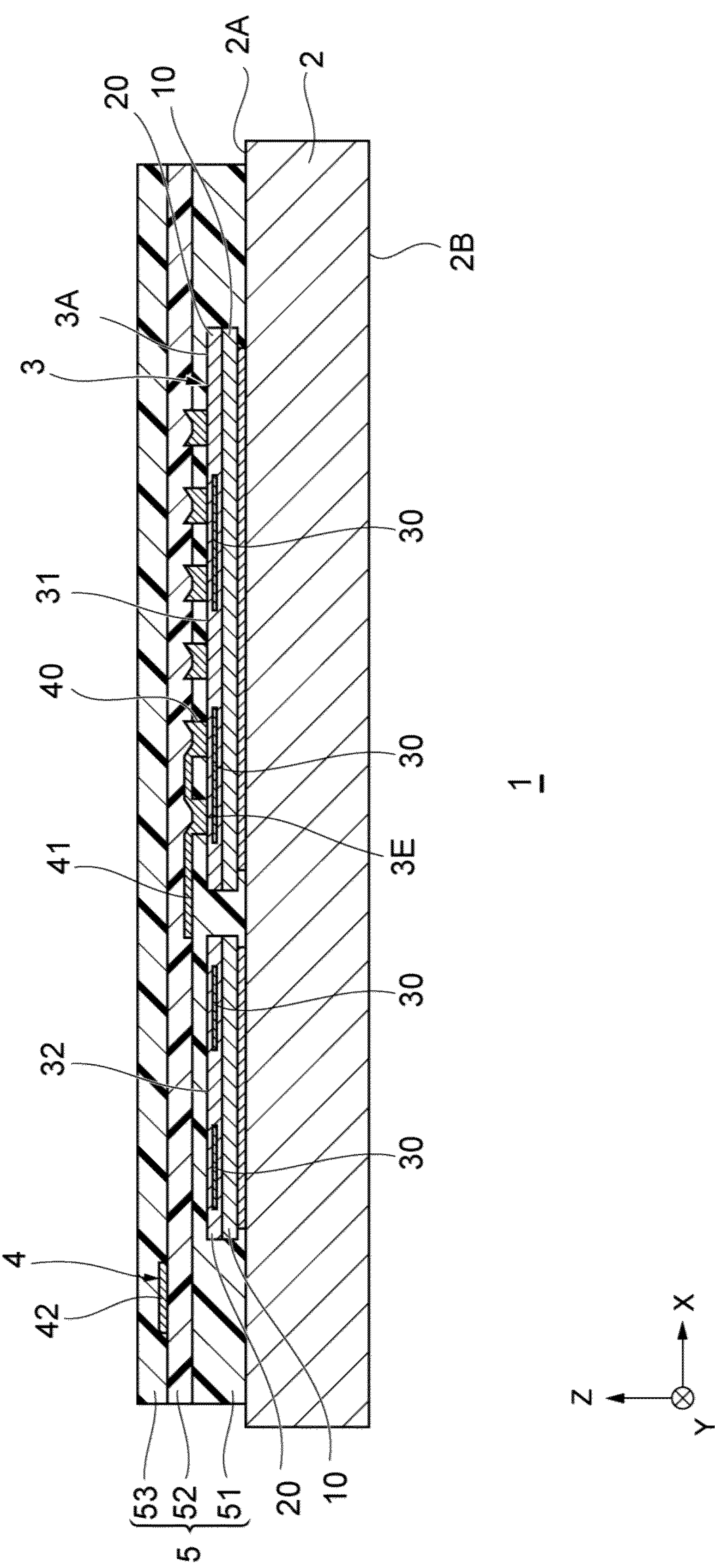
FIG. 3 shows a cross-sectional view illustrating another example of the internal structure of the magnetic sensor device illustrated in FIG. 1.

FIG. 3 is a cross-sectional view illustrating another example of the internal structure of the magnetic sensor device 1 illustrated in FIG. 1. In the example that is illustrated, the magnetic sensor device 1 may include a plurality of the sensor chips 3 (first sensor chip 31 and second sensor chip 32), and each sensor chip 3 may include a plurality of the magnetic detection element 30.

An example of the magnetic detection element 30 is a tunnel magnetoresistance effect (TMR) element. The magnetic detection element 30 is not limited to a TMR element, and may be a giant magnetoresistance (GMR) effect element or may be an anisotropic magnetoresistance (AMR) effect element, may be a Hall element, or may be some other magnetic detection element. TMR elements have a smaller junction area as compared to other types of MR elements and accordingly the size of the sensor chip 3 can be reduced, and also have a great MR ratio whereby output of the sensor chip 3 can be increased, and thus are particularly suited for the magnetic detection element 30.

As illustrated in FIG. 3, the sealing resin 5 may be made up of a plurality of resin layers 51, 52, and 53, which extend in parallel with the first face 2A of the supporting substrate 2, being stacked. The wiring layer 4 is copper plating provided on upper faces of the resin layers 51 and 52, for example, extending following the first face 2A of the supporting substrate 2. In the example that is illustrated, the wiring layer 4 may include a first wiring layer 41 that is provided on the upper face of the resin layer 51, a second wiring layer 42 that is provided on the upper face of the resin layer 52, and so forth.

The wiring layer 4 may be disposed so as to partially overlap the sensor substrate 10 in the perpendicular direction Z, and may be electrically connected to the sensor chip 3. According to this disclosure, the sensor substrate and the supporting substrate that are separately prepared can be electrically connected. In the example that is illustrated, the first wiring layer 41 that makes up part of the wiring layer 4 may be electrically connected to the electrode 3E of the first sensor chip 31 via the vias 40 that pass through the resin layer 51.

The wiring layer 4 may be disposed so as to partially overlap the magnetic detection element in the perpendicular direction Z, or so as not to overlap the magnetic detection element in the perpendicular direction Z. In the example that is illustrated, the first wiring layer 41 extends in a right-left direction X so as to partially overlap the magnetic detection element 30 of the first sensor chip 31. The wiring layer is disposed not to overlap the magnetic detection element, and accordingly thermal stress is not readily caused between the wiring layer and the magnetic detection element.

Figures 4A, 4B, 4C, 4D, 4E, 4F, 4G:
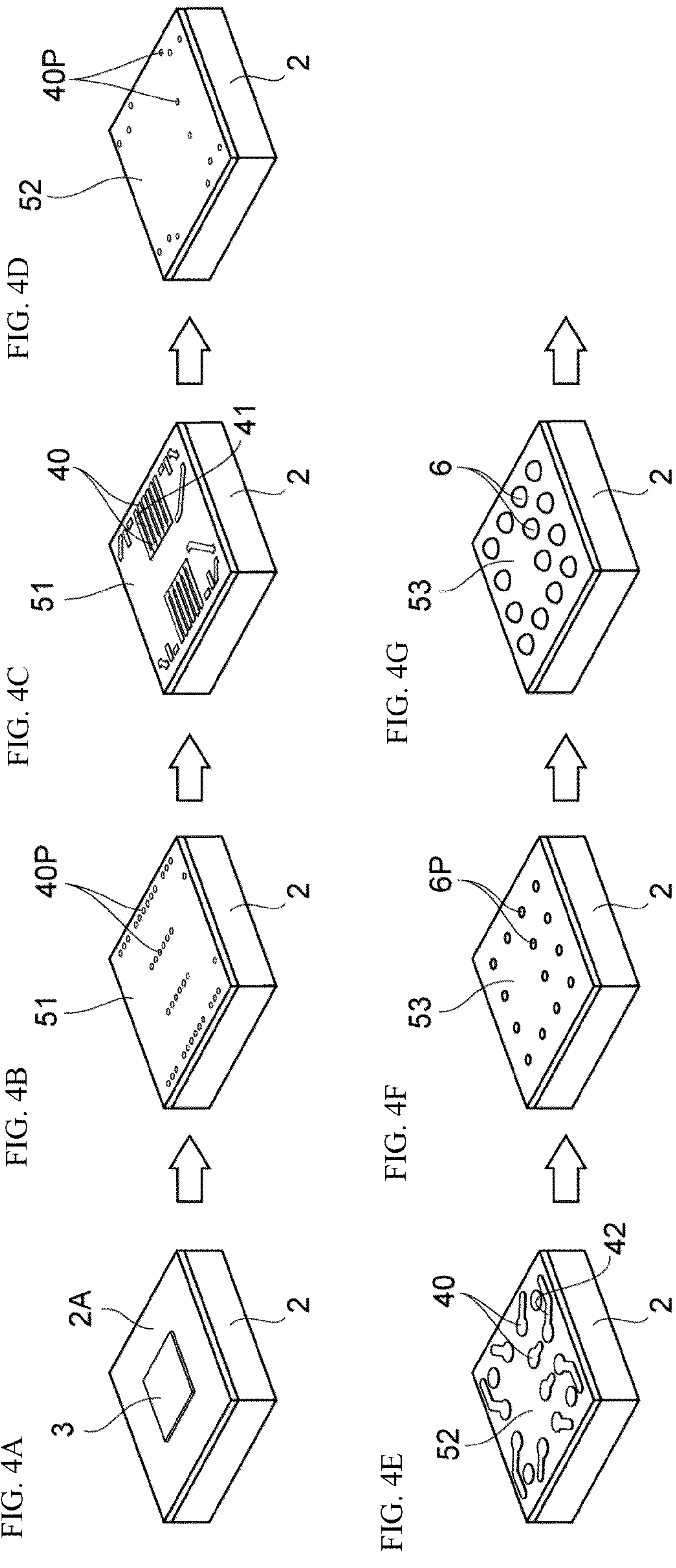
FIGS. 4A to 4G show perspective views for describing manufacturing processes of the magnetic sensor device illustrated in FIG. 1.

Meanwhile, the second wiring layer 42 extends in a front-rear direction Y so as not to overlap the magnetic detection element 30 of the second sensor chip 32. According to this disclosure, the wiring layer is disposed not to overlap the magnetic detection element, and accordingly thermal stress is not readily caused between the wiring layer and the magnetic detection element FIGS. 4A to 4G are perspective views for describing manufacturing processes of the magnetic sensor device 1 illustrated in FIG. 1. As illustrated in FIG. 4A, the sensor chip 3 is fixed to the first face 2A of the supporting substrate 2 using an adhesive agent or the like. As illustrated in FIG. 4B, the resin layer (first resin layer) 51 is formed so as to cover the sensor chip 3 and the first face 2A of the supporting substrate 2, and through holes 40P are opened at the positions of the electrodes 2E and 3E (see FIG. 2), for the vias 40 (see FIG. 3).

As illustrated in FIG. 4C, a seed layer is deposited by sputtering or the like, and the vias 40 and the first wiring layer 41 are formed by plating. These processes may be subtractive processes or may be additive processes. As illustrated in FIG. 4D, the resin layer (second resin layer) 52 is formed so as to cover the vias 40, the first wiring layer 41, and the resin layer 51, and the through holes 40P are opened for the vias 40.

As illustrated in FIG. 4E, the vias 40 and the second wiring layer 42 are formed by a similar process as that in FIG. 4C. As illustrated in FIG. 4F, the resin layer (third resin layer) 53 is formed so as to cover the vias 40, the second wiring layer 42, and the resin layer 52, and through holes 6P are opened for the electrodes 6. As illustrated in FIG. 4G, the through holes 6P are filled with solder or the like, thereby forming the electrodes 6. Following the procedures illustrated in FIGS. 4A to 4G yields the magnetic sensor device 1 illustrated in FIG. 1, in which the separately-prepared supporting substrate 2 and the sensor chip 3 are electrically connected.

The magnetic sensor device 1 according to the present disclosure may be used as a magnetic compass that is installed in electric equipment such as information equipment or the like to detect geomagnetism, may be used as part of an autofocus mechanism and an optical image stabilization mechanism of a camera module, may be used as an angular sensor that detects an angle of a magnetic field generated by a magnet with respect to a reference direction, or may be used as part of a current sensor that detects a value of an electric current flowing through a bus bar.

Figure 5:
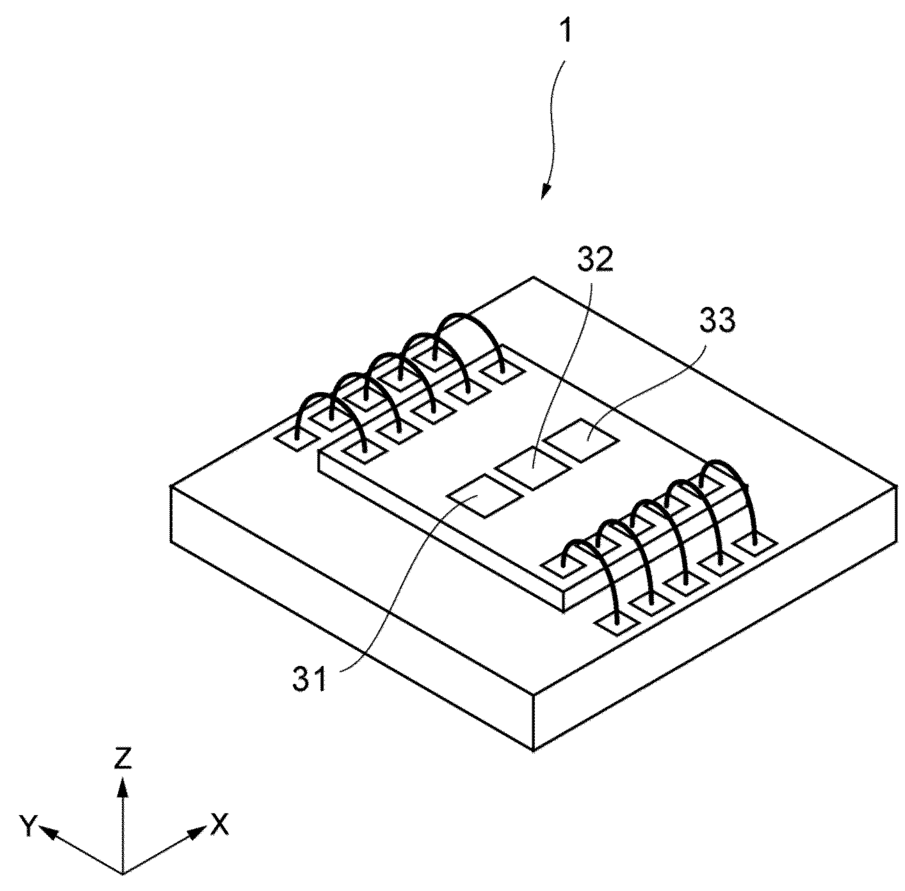
FIG. 5 shows a perspective view illustrating an example of a magnetic sensor device that is configured as a magnetic compass.

FIG. 5 is a diagram illustrating an example of the magnetic sensor device configured as a magnetic compass that generates a detection value corresponding to an angle of geomagnetism. As illustrated in FIG. 5, the magnetic sensor device 1 may include three sensor chips 3 (first through third sensor chips 31, 32, and 33), configured such that the first through third sensor chips 31, 32, and 33 each detect a respective one of components of an external magnetic field in three directions that are orthogonal to each other.

Figure 6:
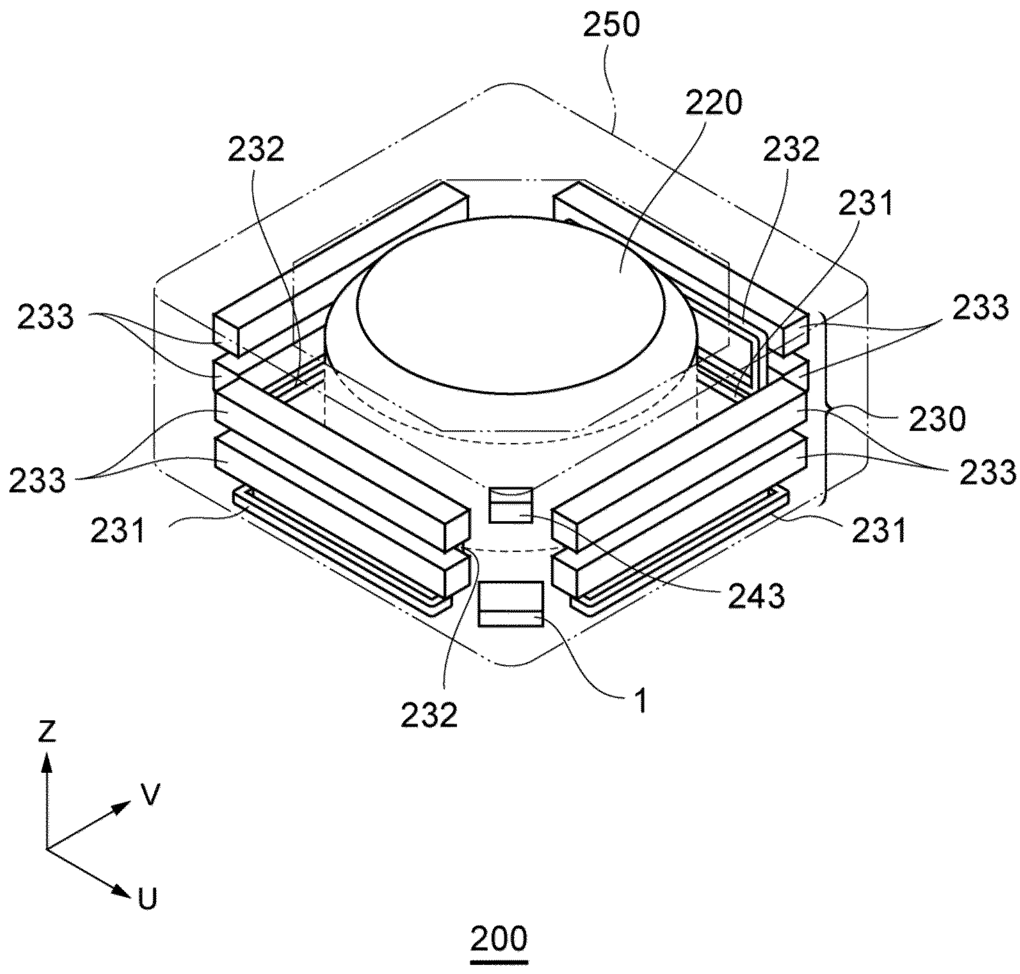
FIG. 6 shows a perspective view illustrating an example of a magnetic sensor device used as part of an autofocus mechanism and an optical image stabilization mechanism of a camera module.
Figure 7:
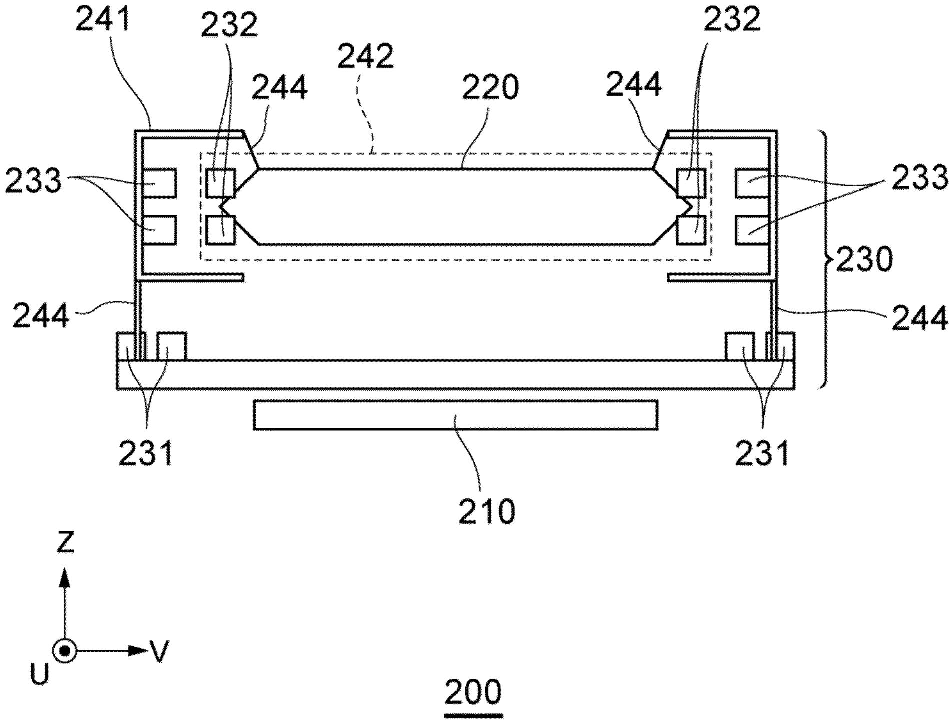
FIG. 7 shows a cross-sectional view illustrating an internal structure of the camera module illustrated in FIG. 6.

FIG. 6 is a perspective view illustrating an example of the magnetic sensor device 1 used as part of an autofocus mechanism and an optical image stabilization mechanism of a camera module 200. FIG. 7 is a cross-sectional view illustrating an internal structure of the camera module 200 illustrated in FIG. 6. The autofocus mechanism and the optical image stabilization mechanism of the camera module 200 includes a drive device 230 for moving a lens 220, and controls the drive device 230 on the basis of position information of the lens 220 detected by a plurality of the magnetic sensor devices 1.

In detail, the autofocus mechanism detects a state in which a subject is in focus, by an image sensor, an autofocus sensor, or the like, and moves the lens in a Z direction with respect to the image sensor. The optical image stabilization mechanism detects shaking by a gyro sensor or the like, and moves the lens in a U direction and/or a V direction with respect to the image sensor.

The camera module 200 illustrated in FIG. 6 may include an image sensor 210 such as a complementary metal-oxide semiconductor (CMOS) device, the lens 220 that is positioned with respect to the image sensor 210, a first holding member 241 that is movable in the U direction and the V direction with respect to the image sensor 210, a second holding member 242 that is movable in the Z direction with respect to the first holding member 241, a plurality of wires 244 that support the first holding member 241 and the second holding member 242 and that are elastically deformable, the drive device 230 that moves the first holding member 241 and the second holding member 242, a housing 250 that accommodates these members, and so forth.

The autofocus mechanism and the optical image stabilization mechanism of the camera module 200 may include, in addition to the drive device 230 and the plurality of magnetic sensor devices 1, a processor that controls the drive device 230, an autofocus sensor that detects a state in which a subject is in focus, a gyro sensor that detects shaking, and so forth. The processor, the autofocus sensor, the gyro sensor, and so forth, which are omitted from illustration, may be disposed outside of the housing.

The lens 220 may be fixed inside of the second holding member 242 that is formed as a tube. The second holding member 242 may be accommodated within the first holding member 241 that is formed as a box, along with the lens 220. At least one second magnet 243 may be fixed to the second holding member 242, for at least one magnetic sensor device 1 to detect position information of the second holding member 242.

The drive device 230 may include a plurality of first coils 231, a plurality of second coils 232, a plurality of first magnets 233, and so forth. The plurality of first coils 231 may be fixed to the housing 250. The plurality of second coils 232 may be fixed to the second holding member 242. The plurality of first magnets 233 may be fixed to the first holding member 241. The plurality of first coils 231 may face respective first magnets 233. The plurality of second coils 232 may face respective first magnets 233.

In a case of the autofocus mechanism, upon a current flowing to an optional second coil 232 under a command from the processor, the second holding member 242 fixed to the second coils 232 is moved in the Z direction by interaction between a magnetic field generated by the first magnets 233 and a magnetic field generated by the second coil 232. At least one magnetic sensor device 1 generates a detection signal on the basis of a composite magnetic field, in which a magnetic field generated by at least one second magnet 243 fixed to the second holding member 242 and the magnetic field generated from the first magnets 233 fixed to the first holding member 241 are composited, and the detection signal is transmitted to the processor. The processor may detect the position information of the lens 220 in the Z direction from the detection signal, and controls the drive device 230 so that the subject is in focus.

In a case of the optical image stabilization mechanism, upon a current flowing to an optional first coil 231 under a command from the processor, the first holding member 241 fixed to the first magnets 233 is moved in the U direction and/or the V direction by interaction between a magnetic field generated by the first magnets 233 and a magnetic field generated by the first coil 231. The plurality of magnetic sensor devices 1 each may generate a detection signal on the basis of the position of the corresponding first magnet 233, and transmit the detection signal to the processor. The processor may detect the position information of the lens 220 in the U direction and in the V direction from the detection signals, and controls the drive device 230 so as to correct shaking.

FIGS. 8A and 8B are diagrams illustrating an example of a magnetic sensor device 1 that is configured as an angular sensor for generating a detection value corresponding to an angle of a detection object. In the example that is illustrated, the magnetic sensor device 1 may be configured as an angular sensor that detects an angle of a magnet 300 that is cylindrical and that is rotatable about a center axis O serving as a rotational axis. In the example that is illustrated, an X direction, a Y direction, and the Z direction may be orthogonal to each other, and the center axis O is parallel to the Z direction.

The magnetic sensor device 1 may detect a first component, of magnetic field components MF generated by the magnet 300 and applied to the magnetic sensor device 1, in a direction that is parallel to the X direction, and generates a first detection signal representing an intensity of the first component, and also detects a second component of the magnetic field generated by the magnet 300 in a direction that is parallel to the Y direction, and generates a second detection signal representing an intensity of the second component. A processor, which is omitted from illustration, may calculate an angle θ of the magnetic field generated by the magnet 300 as to a reference direction DR, by calculating an arctangent of a ratio of the first detection signal and the second detection signal.

FIG. 9 is a diagram illustrating an example of a magnetic sensor device 1 that is used as part of a current sensor 400 that generates a detection value in accordance with a current value that is an object of detection. In the example that is illustrated, the current sensor 400 is configured to detect a value of a current Itg flowing over a bus bar 410. A magnetic field MF is generated around the bus bar 410 by the current Itg. The current sensor 400 may be disposed near the bus bar 410, at a position at which the magnetic field MF is applied.

Figure 10:
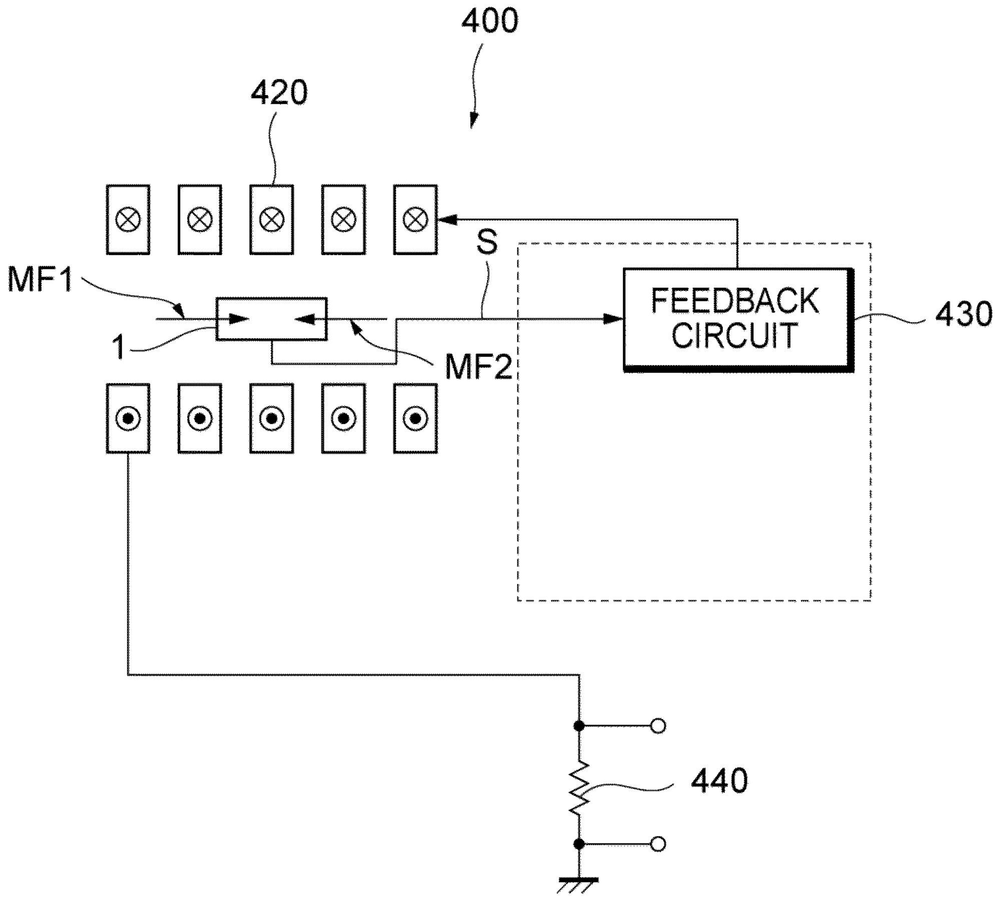
FIG. 10 shows a diagram illustrating a circuit configuration of the current sensor illustrated in FIG. 9.

FIG. 10 is a diagram illustrating a circuit configuration of the current sensor 400 illustrated in FIG. 9. In the example that is illustrated, the current sensor 400 is configured as a magnetic equilibrium current sensor. The current sensor 400 includes in addition to the magnetic sensor device 1, coils 420. The coils 420 are to generate a second magnetic field MF2 that cancels out a first magnetic field MF1 of the magnetic field MF. The magnetic sensor device 1 may detect a residual magnetic field of the first magnetic field MF1 and the second magnetic field MF2, and generate a magnetic field detection value S in accordance with intensity of this magnetic field.

The current sensor 400 may further include a feedback circuit 430, a current detector 440, and so forth. The feedback circuit 430 applies, to the coil 420, a feedback current for generating the second magnetic field MF2, on the basis of the magnetic field detection value S. The current detector 440 detects a value of the feedback current flowing at the coil 420. The current detector 440 is, for example, a resistor that is inserted in the current path of the feedback current. In this case, potential difference between the two ends of the resistor is equivalent to the detection value of the feedback current. The detection value of the feedback current is in a proportionate relation with the value of the current Itg on the bus bar 410, and accordingly, the value of the current Itg can be detected from the detection value of the feedback current.

Next, description will be made regarding the protective film 20 of the magnetic sensor device 1 according to the present embodiment, with reference to FIGS. 11 to 16. One feature of the magnetic sensor device 1 according to the present embodiment is that the protective film 20 is a layered film having a first layer 21 of which alumina is the primary component, and a second layer 22 of which silica is the primary component.

The first layer 21 and the second layer 22 making up the protective film 20 are layered in the perpendicular direction Z. The protective film 20 may include a plurality of the first layers 21, and may include a plurality of the second layers 22, which will be described in detail later. The magnetic detection element 30 may be disposed inside of the protective film 20 that is the layered film.

Although there is some difference depending on temperature range and measurement method, the coefficient of linear expansion of alumina (aluminum oxide, $Al_2O_3$) is 7.7 ppm/K, for example, the coefficient of linear expansion of silica (silicon dioxide, $SiO_2$) is 0.7 ppm/K, for example, and the coefficient of linear expansion of copper (Cu) is 17 ppm/K, for example. Alumina, which is the primary component of the first layer 21 has a coefficient of linear expansion that is smaller than that of the metal such as copper or the like making up the wiring layer 4, and that is greater that silica which is the primary component of the second layer 22, i.e., that is approximately halfway between metal and silica.

FIGS. 11 to 14 are cross-sectional views illustrating a plurality of configuration examples of the protective film 20 illustrated in FIG. 2. In a first example illustrated in FIG. 11, the protective film 20 may be configured as a two-layer layered film in which the second layer 22 (layer of which the primary component is silica) and the first layer 21 (layer of which the primary component is alumina) be layered in that order from the side closer to the first face 2A of the supporting substrate 2. In the first example, the magnetic detection element 30 may be disposed inside the first layer 21.

Figure 12:
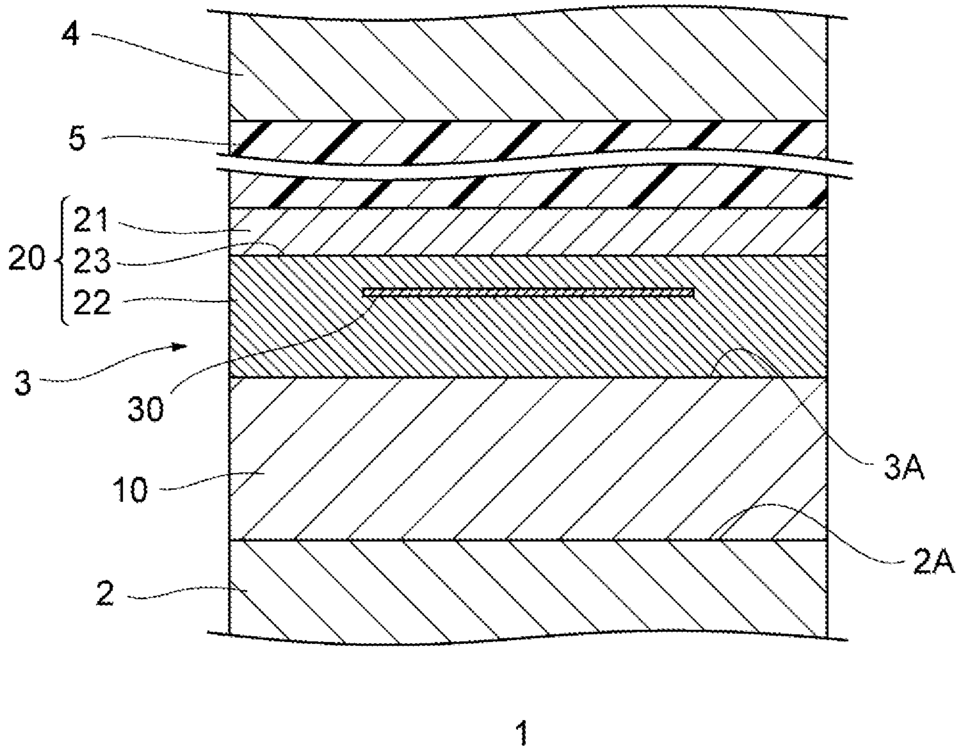
FIG. 12 shows a cross-sectional view illustrating a second example of the configuration of the protective film illustrated in FIG. 2.

In a second example illustrated in FIG. 12, the protective film 20 may be configured as a two-layer layered film in which the second layer 22 (layer of which the primary component is silica) and the first layer 21 (layer of which the primary component is alumina) are layered in that order from the side closer to the first face 2A of the supporting substrate 2. In the second example, the magnetic detection element 30 may be disposed inside the second layer 22. According to the first and second examples, the magnetic detection element can be disposed so as not to be in contact with the boundary of the first layer and the second layer. [claim3]

Figure 13:
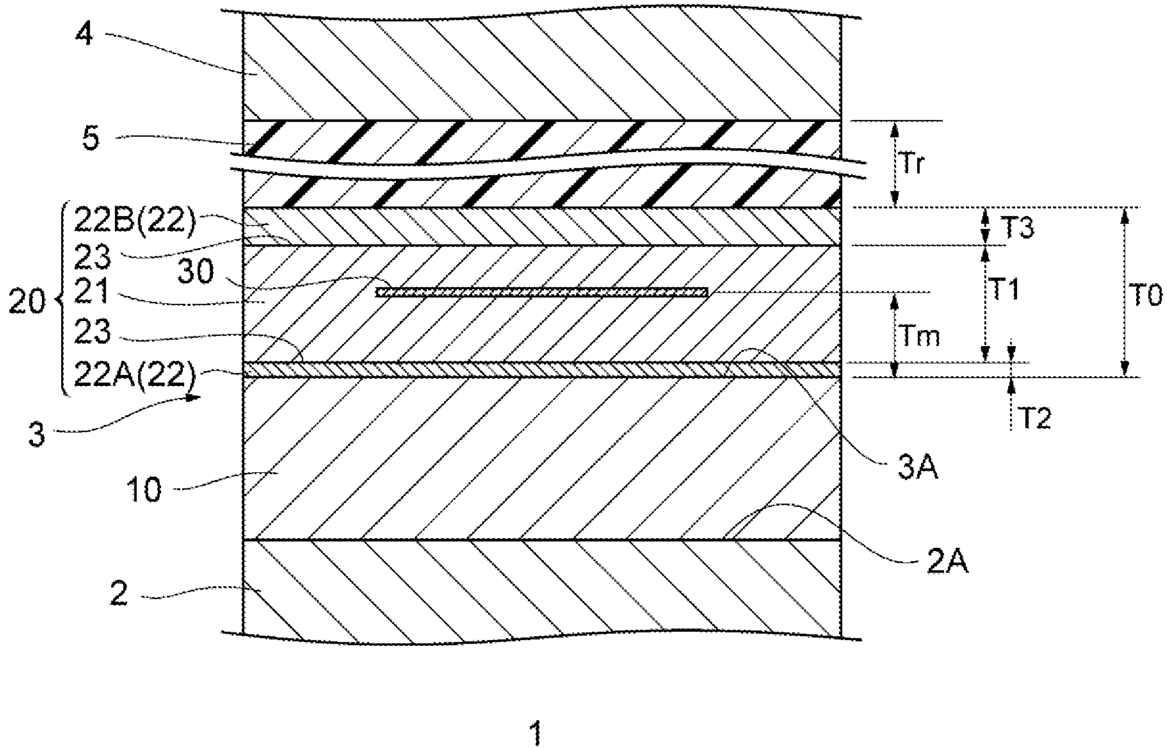
FIG. 13 shows a cross-sectional view illustrating a third example of the configuration of the protective film illustrated in FIG. 2.
Figure 14:
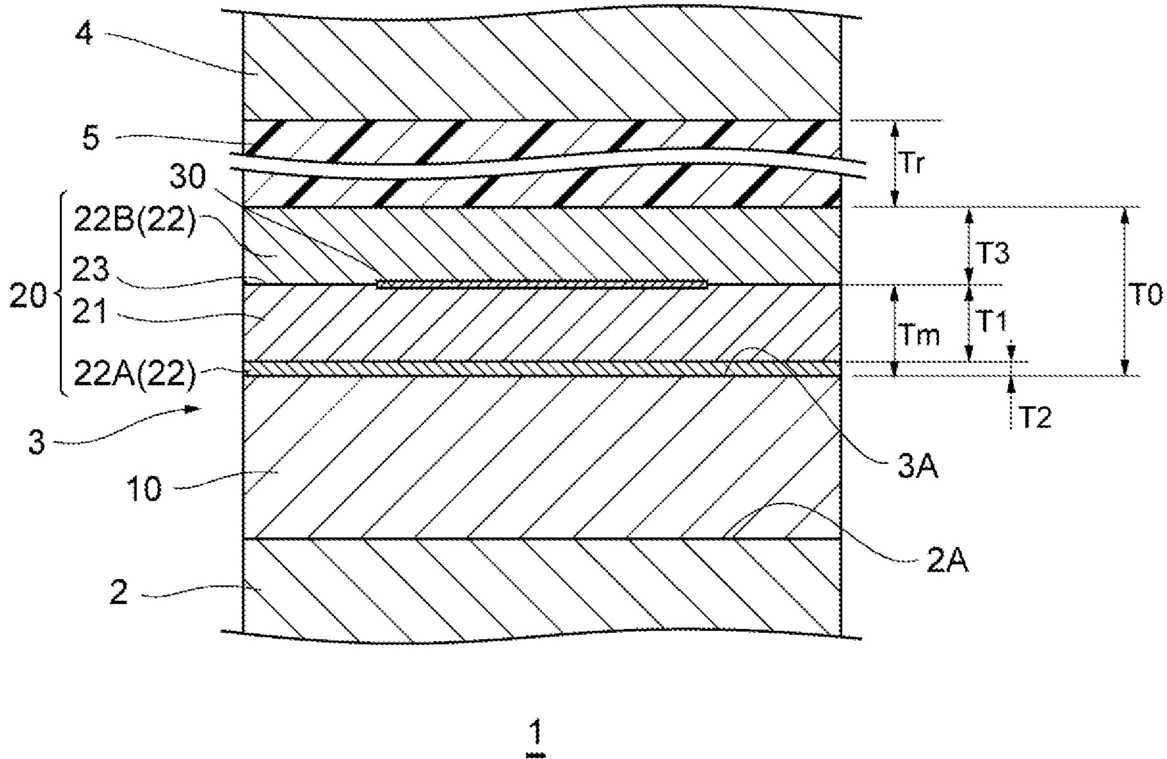
FIG. 14 shows a cross-sectional view illustrating a fourth example of the configuration of the protective film illustrated in FIG. 2.

In a third example illustrated in FIG. 13 and a fourth example illustrated in FIG. 14, the protective film 20 is configured as a three-layer layered film in which a second layer 22A (layer of which the primary component is silica), the first layer 21 (layer of which the primary component is alumina), and a second layer 22B (layer of which the primary component is silica), are layered in that order from the side closer to the first face 2A of the supporting substrate 2. In the third example, the magnetic detection element 30 is disposed inside the first layer 21. In the fourth example, the magnetic detection element 30 is disposed in contact with the boundary of the first layer 21 and the second layer 22.

Figure 15:
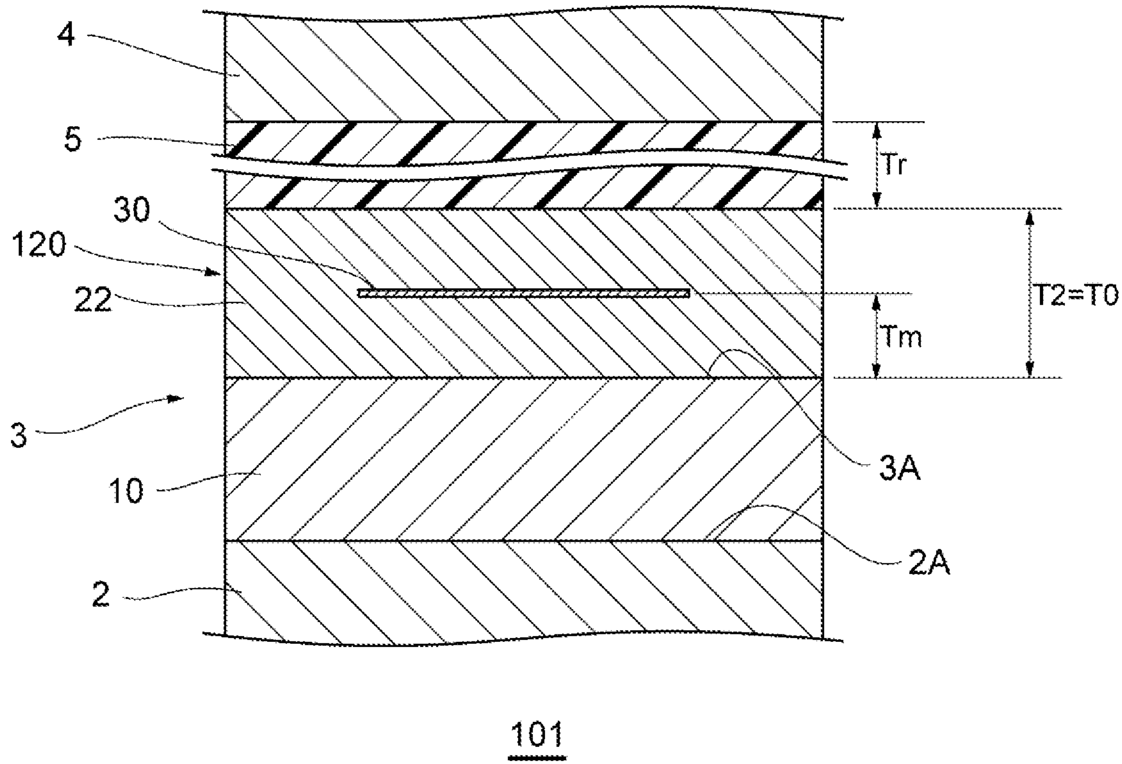
FIG. 15 shows a cross-sectional view illustrating a configuration of a protective film that is not a deposited film according to the present disclosure, illustrated for comparison with FIGS. 11 to 14.

FIG. 15 is a cross-sectional view illustrating a configuration of a protective film 120 that is not a layered film, for comparison with FIGS. 11 to 14. In the example illustrated in FIG. 15, the protective film 120 is made up of just the second layer 22 of which the primary component is silica, instead of a layered film of the first layer 21 of which the primary component is alumina and the second layer 22 of which the primary component is silica.

As illustrated in FIGS. 11 and 13 to 15, a thickness of the protective film 20 in the perpendicular direction Z is represented by T0, a thickness of the first layer 21 by T1, a thickness of the second layer 22 (22A) provided on the upper face 3A of the sensor substrate 10 by T2, a thickness of the second layer 22 (22B) provided on the upper face of the first layer 21 by T3, a distance from the upper face 3A of the sensor substrate 10 to the magnetic detection element 30 by Tm, and a distance from an upper face of the protective film 20 to a lower face of the wiring layer 4 (thickness of sealing resin 5) by Tr. T0=T1+T2+T3 holds.

Figure 11:
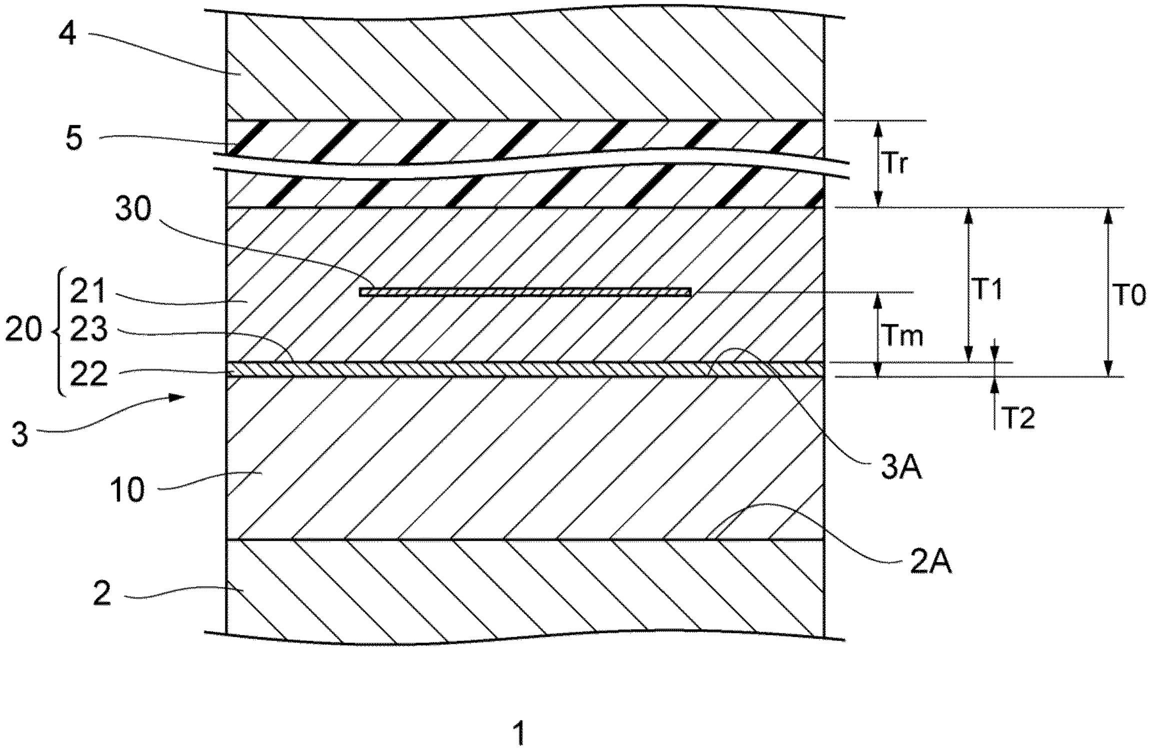
FIG. 11 shows a cross-sectional view illustrating a first example of a configuration of a protective film illustrated in FIG. 2.
Figure 16:
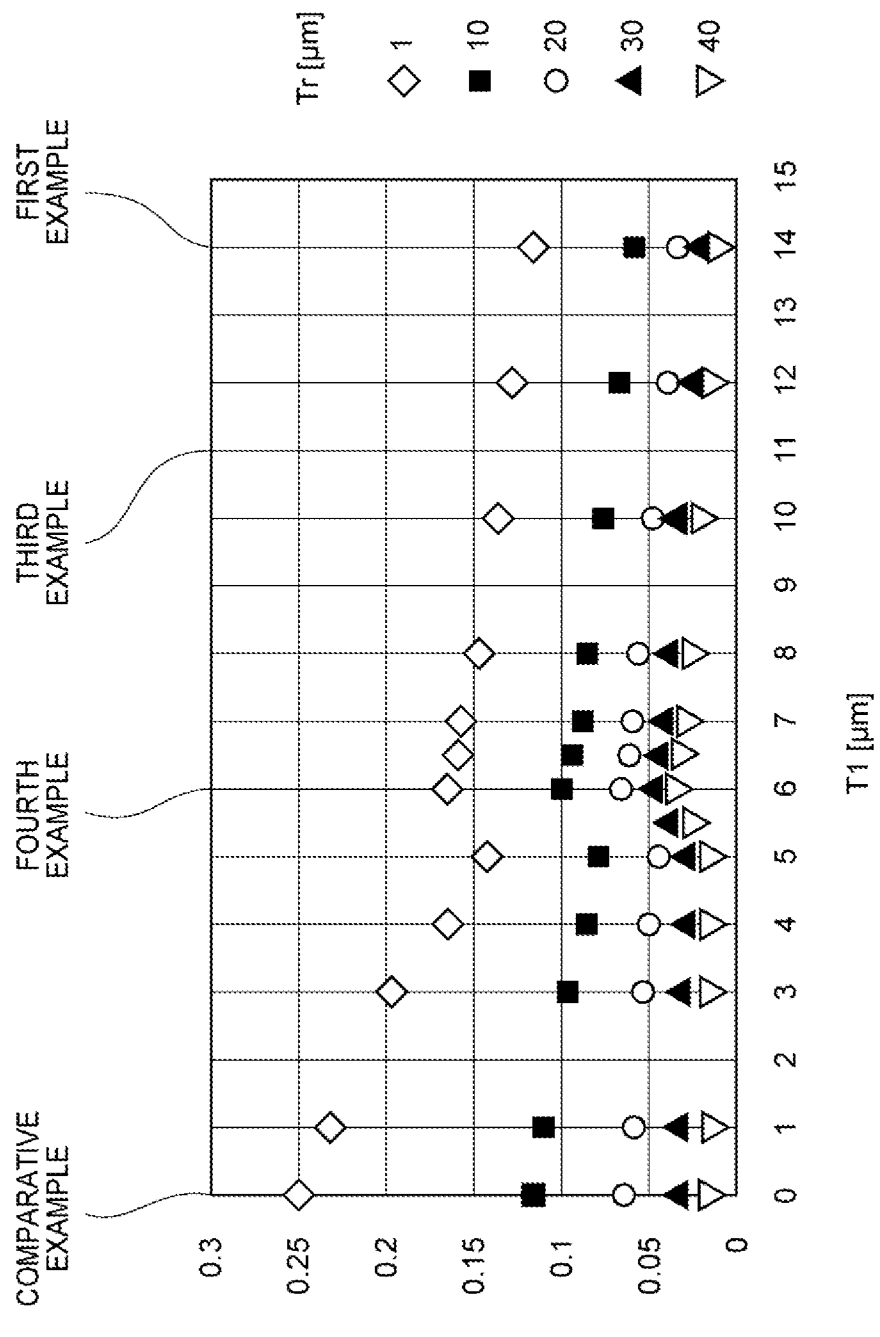
FIG. 16 shows a diagram showing a relation between the configurations of the protective films illustrated in FIGS. 11, 13, 14, and 15, and angular error.

FIG. 16 is a graph illustrating angular error of the magnetic sensor device 1 that has the protective film 20, which is the object of the present disclosure, and angular error of a magnetic sensor device 101 that has the protective film 120, which is not the object of the present disclosure, and is a comparative example. The configuration examples illustrated in FIGS. 11, 13, and 14 are shown as the protective film 20 which is the object of the present disclosure, and a configuration of the protective film 120 illustrated in FIG. 15 is shown as the protective film 120 that is the comparative example.

In FIG. 16, T0=15 μm, Tm=7 μm, and T2=1 μm, the horizontal axis is the thickness T1 of the first layer 21 of which alumina is the primary component, and the vertical axis is angular error of the magnetic sensor device 1 including the protective film 20 that is the object of the present disclosure and the magnetic sensor device 101 including the protective film 120 that is not the object of the present disclosure. Simulation results are plotted regarding a case of applying a predetermined stress value to the magnetic sensor devices 1 and 101 while changing the distance Tr from the upper faces of the protective films 20 and 120 to the lower face of the wiring layer 4 in five patterns of Tr=1 μm, 10 μm, 20 μm, 30 μm, and 40 μm.

The plot for T1=0 μm on the horizontal axis indicates the comparative example, in which the protective film 120 is made up of just the second layer 22 of which the primary component is silica. Other plots for T1, i.e., plots in which T1 is no less than 1 μm, indicate results using the protective film 20 that is the object of the present disclosure. For T1=1 to 5 μm, the magnetic detection element 30 is disposed inside the second layer 22 of which the primary component is silica. For T1=6 μm, the magnetic detection element 30 is disposed so as to be in contact with the boundary of the first layer and the second layer. For T1=7 to 14 μm, the magnetic detection element 30 is disposed inside the first layer 21 of which the primary component is alumina.

As shown in FIG. 16, the greater the thickness T1 of the first layer 21, of which the primary component is alumina, becomes, the smaller the angular error of the magnetic sensor device 1 tends to become. Also, the greater the distance Tr from the upper face of the protective film 20 to the lower face of the wiring layer 4 is, the smaller the angular error of the magnetic sensor device 1 tends to become.

By providing the first layer 21 of which the primary component is alumina in the protective film 20 that surrounds the magnetic detection element 30, the angular error can, in many cases, be made to be smaller as compared to a case of T1=0 μm where no such layer is provided. The magnetic detection element 30 may be disposed inside the first layer 21, as with T1=7 to 14 μm, or the magnetic detection element 30 may be disposed inside the second layer 22, as with T1=1 to 5 μm. Disposing the magnetic detection element 30 inside the first layer 21 enables the angular error to be made even smaller.

In further detail, in a case of T1=1 to 5 μm or T1=12 to 14 μm, the angular error can be made to be smaller than a cases in which T1=0 μm, in all five patterns of Tr=1 μm, 10 μm, 20 μm, 30 μm, and 40 μm. In a case of T1=10 μm, the angular error can be made to be smaller than a cases in which T1=0 μm, in four patterns of Tr=1 μm, 10 μm, 20 μm, and 30 μm, excluding Tr=40 μm. In a case of T1=5.5 μm or T1=6.5 μm to 8 μm, the angular error can be made to be smaller than a cases in which T1=0 μm, in three patterns of 1 μm, 10 μm, and 20 μm, excluding Tr=30 μm and 40 μm.

When the magnetic detection element 30 is in contact with a boundary 23 of the first layer 21 and the second layer 22 as with the case of T1=6 μm, the angular error is greater than that of a case of T1=1 to 5 μm and 7 to 14 μm where the magnetic detection element 30 is not in contact with the boundary 23 of the first layer 21 and the second layer 22. The magnetic detection element 30 may not be in contact with the boundary 23 of the first layer 21 and the second layer 22. According to this disclosure, the magnetic detection element is less readily affected by thermal stress, as compared to a case of being in contact with the boundary of the first layer and the second layer. However, even in an arrangement in which the magnetic detection element 30 is in contact with a boundary 23 of the first layer 21 and the second layer 22, the angular error can be made to be smaller than T1=0 μm in two patterns of Tr=1 μm and 10 μm.

According to the magnetic sensor device 1 configured as described above, the first layer 21 of which the primary component is alumina is provided in the protective film 20 that surrounds the magnetic detection element 30, and accordingly the difference in the coefficient of linear expansion between the wiring layer 4 and the second layer 22 of which the primary component is silica can be reduced. The thermal stress between the wiring layer 4 and the magnetic detection element 30 that occurs due to change in temperature can be reduced, and accordingly output characteristics of the magnetic detection element 30 of the magnetic sensor device 1 stabilize. For example, in a case of configuring the magnetic sensor device 1 as an angular sensor, the angular error can be reduced as in FIG. 16.

The first layer 21 with the primary component of alumina that has higher thermal conductivity than silica is provided, and accordingly heat generated at the magnetic sensor device 1 can be efficiently dissipated, and temperature change does not readily occur. Thermal stress due to temperature change is also small, as described above, thereby enabling usage over a broad temperature range.

The first layer 21 with the primary component of alumina that has superior toughness as compared to silica is provided, and accordingly cracks are not readily formed in the magnetic detection element 30 even when shock is applied at the time of fixing the sensor substrate 10 to the supporting substrate 2, and hence, product yield improves. Thus, according to the present disclosure, the magnetic sensor device 1 with excellent various characteristics, such as output characteristics, can be provided.

In detail, a magnetic sensor device according to an aspect of the present disclosure includes: a supporting substrate that has a first face; a magnetic detection element; a layered film that is disposed on the first face side and that has a first layer of which a primary component is alumina, and a second layer of which a primary component is silica; and a wiring layer that is disposed on the first face side and is situated at a position farther from the supporting substrate than the layered film, and moreover extends along the first face, wherein the magnetic detection element is disposed inside the layered film.

Alumina has a coefficient of linear expansion that is intermediate between metal that makes up the wiring layer, and silica. By providing the first layer, of which the primary component is alumina, in the layered film, inside which the magnetic detection element is disposed, difference in the coefficient of linear expansion between the wiring layer and the second layer of which the primary component is silica can be reduced, and the thermal stress between the wiring layer and the magnetic detection element that occurs due to change in temperature can be reduced. Thus, output characteristics of the magnetic detection element stabilize, and measurement precision of the magnetic sensor device improves. The first layer may be made using other materials, as long as their coefficient of linear expansion is intermediate between metal and silica, similar to that of with alumina.

The embodiment described above is for facilitating understanding of the present disclosure, and is not to be construed as limiting the present disclosure. The elements included in the embodiment, and the layout, materials, conditions, shapes, sizes, and so forth, thereof are not limited to those exemplified, and can be modified as appropriate. Also, configurations described in different embodiments can be partially substituted or combined with each other.

What is claimed is:

1. A magnetic sensor device, comprising:
a supporting substrate that has a first face;
a magnetic detection element;
a layered film that is disposed on the first face side and that has a first layer having a first linear expansion coefficient, and a second layer of having a second linear expansion coefficient; and
a wiring layer that is disposed on the first face side and is situated at a position farther from the supporting substrate than the layered film, and moreover extends along the first face, the wiring layer having a third linear expansion coefficient, the first linear expansion coefficient being smaller than the third linear expansion coefficient and larger than the second linear expansion coefficient, wherein
the magnetic detection element is disposed inside the layered film.

2. The magnetic sensor device according to claim 1, wherein
the magnetic detection element is not in contact with a boundary of the first layer and the second layer.

3. The magnetic sensor device according to claim 1, wherein
the magnetic detection element is disposed inside the first layer.

4. The magnetic sensor device according to claim 1, wherein
the magnetic detection element is disposed inside the second layer.

5. The magnetic sensor device according to claim 1, wherein
the wiring layer is disposed not to overlap the magnetic detection element in a perpendicular direction to the first face.

6. The magnetic sensor device according to claim 1, wherein
the wiring layer is disposed to partially overlap the magnetic detection element in a perpendicular direction to the first face.

7. The magnetic sensor device according to claim 1, further comprising:
a sensor substrate that is disposed between the first face and the layered film, and that is fixed to the first face.

8. The magnetic sensor device according to claim 7, wherein
the wiring layer is disposed to partially overlap the sensor substrate in a perpendicular direction to the first face.

9. The magnetic sensor device according to claim 7, wherein
the first face and the layered film are completely separated from each other by the sensor substrate and do not directly contact each other.

10. An angular sensor, comprising:
the magnetic sensor device according to claim 1.

11. A magnetic compass, comprising:
the magnetic sensor device according to claim 1.

12. A current sensor, comprising:
the magnetic sensor device according to claim 1.

13. A camera module, comprising:
an autofocus mechanism and/or an optical image stabilization mechanism including the magnetic sensor device according to claim 1.

14. The magnetic sensor device according to claim 1, wherein
a primary component of the first layer is alumina, and
a primary component of the second layer is silica.

15. The magnetic sensor device according to claim 1, wherein
the first linear expansion coefficient is approximately halfway between the third linear expansion coefficient and the second linear expansion coefficient.

16. A magnetic sensor device, comprising:
a supporting substrate that has a first face;
a magnetic detection element;
a layered film that is disposed on the first face side and that has a first layer of which a primary component is alumina, and a second layer of which a primary component is silica, the first layer having a first surface parallel with the first face, the second layer having a second surface parallel with the first face, the first surface and the second surface being in direct contact with each other; and
a wiring layer that is disposed on the first face side and is situated at a position farther from the supporting substrate than the layered film, and moreover extends along the first face, wherein
the magnetic detection element is disposed inside the layered film.

17. A magnetic sensor device, comprising:
a supporting substrate that has a first face;
a magnetic detection element;
a layered film that is disposed on the first face side and that has a first layer of which a primary component is alumina, and a second layer of which a primary component is silica; and
a wiring layer that is disposed on the first face side and is situated at a position farther from the supporting substrate than the layered film, and moreover extends along the first face, wherein
the magnetic detection element is disposed inside the layered film, and
the wiring layer and the first face sandwich the layered film therebetween in a direction perpendicular to the first face.

* * * * *